United States Patent
Chae et al.

(10) Patent No.: US 7,420,856 B2
(45) Date of Patent: Sep. 2, 2008

(54) METHODS AND CIRCUITS FOR GENERATING A HIGH VOLTAGE AND RELATED SEMICONDUCTOR MEMORY DEVICES

(75) Inventors: Dong-Hyuk Chae, Seoul (KR); Young-Ho Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/294,810

(22) Filed: Dec. 6, 2005

(65) Prior Publication Data
US 2006/0133149 A1 Jun. 22, 2006

(30) Foreign Application Priority Data
Dec. 20, 2004 (KR) .............. 10-2004-0108789

(51) Int. Cl.
*G11C 5/14* (2006.01)
(52) U.S. Cl. .................. 365/189.09; 365/185.19; 365/185.18
(58) Field of Classification Search .......... 365/185.19, 365/189.09
See application file for complete search history.

(56) References Cited

U.S. PATENT DOCUMENTS

| | | | | |
|---|---|---|---|---|
| 5,596,532 A | * | 1/1997 | Cernea et al. | 365/185.18 |
| 5,754,061 A | * | 5/1998 | Satou et al. | 326/110 |
| 5,805,499 A | * | 9/1998 | Haddad | 365/185.19 |
| 5,898,335 A | * | 4/1999 | Miyamoto et al. | 327/535 |
| 5,995,416 A | * | 11/1999 | Naura et al. | 365/185.18 |

(Continued)

FOREIGN PATENT DOCUMENTS

JP 06-037285 2/1994

(Continued)

OTHER PUBLICATIONS

Suh et al. "A 3.3 V 32 Mb NAND Flash Memory with Incremental Step Pulse Programming Scheme," *IEEE Journal of Solid-State Circuits*, vol. 30, No. 11, Nov. 1995, pp. 1149-1156.

(Continued)

*Primary Examiner*—Huan Hoang
*Assistant Examiner*—Anthan T Tran
(74) *Attorney, Agent, or Firm*—Myers Bigel Sibley & Sajovec

(57) ABSTRACT

Methods of generating a program voltage for programming a non-volatile memory device include generating an initial voltage and generating a first ramping voltage in response to the initial voltage. The first ramping voltage has a ramping speed slower than the ramping speed of the initial voltage. A second ramping voltage is generated in response to the first ramping voltage. The second ramping voltage has a lower ripple than the first ramping voltage. The second ramping voltage is output as a program voltage for programming a non-volatile memory device. A program voltage generating circuit includes a program voltage generating unit configured to generate an initial voltage, a ramping circuit configured to generate a first ramping voltage responsive to the initial voltage, and a voltage controlling unit configured to generate a second ramping voltage having relatively low ripple and to output the first ramping voltage or the second ramping voltage responsive to a voltage level of the first ramping voltage. Semiconductor memory devices including program voltage generating circuits are also disclosed.

38 Claims, 9 Drawing Sheets

U.S. PATENT DOCUMENTS

| | | | | |
|---|---|---|---|---|
| 6,009,022 | A * | 12/1999 | Lee et al. | 365/189.09 |
| 6,043,637 | A * | 3/2000 | Suzu | 323/313 |
| 6,278,639 | B1 * | 8/2001 | Hosono et al. | 365/189.09 |
| 6,392,931 | B1 * | 5/2002 | Pasotti et al. | 365/185.19 |
| 6,958,947 | B2 * | 10/2005 | Park et al. | 365/228 |
| 2003/0184361 | A1 * | 10/2003 | Tanimoto | 327/536 |

FOREIGN PATENT DOCUMENTS

| | | |
|---|---|---|
| JP | 10-050077 | 2/1998 |
| JP | 2000-100184 | 4/2000 |
| KR | 10-1994-22550 | 10/1994 |

OTHER PUBLICATIONS

Notice to File a Response/Amendment to the Examination Report for Korean Patent Application No. 10-2004-0108789 mailed on Apr. 28, 2006.

* cited by examiner

METHODS AND CIRCUITS FOR GENERATING A HIGH VOLTAGE AND RELATED SEMICONDUCTOR MEMORY DEVICES

CROSS-REFERENCE TO RELATED APPLICATION

This application claims priority under 35 U.S.C. § 119 to Korean Patent Application No. 2004-108789 filed on Dec. 20, 2004, the disclosure of which is incorporated herein by reference in its entirety.

FIELD OF THE INVENTION

The present invention relates to electric circuits and related methods, and more particularly, to circuits and methods for generating a voltage level.

BACKGROUND

A semiconductor memory device is a microelectronic device used in digital logic circuits such as microprocessors, which are in turn used in a wide range of electronic devices, from consumer electronic devices to satellites. Accordingly, the progress of technology for manufacturing highly integrated, high speed semiconductor memory devices is a key technology driver for increasing the performance of digital logic circuits.

Semiconductor memory devices may be classified as volatile memory devices or non-volatile memory devices. Data may be stored in a volatile memory device, and data stored in a volatile memory device can be read while electric power is supplied to the volatile memory device. However, data stored in a volatile memory device may be cleared when electric power is not supplied to the device. In contrast, a non-volatile memory device can continue to store data even when electric power is not being supplied to the device. Some types of non-volatile memory devices include mask read only memory (MROM), programmable read only memory (PROM), erasable and programmable ROM (EPROM), and/or electrically erasable and programmable ROM (EEPROM). Among the non-volatile memory devices, flash memory is widely used for computer and memory card storage since flash memory has the capability of simultaneously electrically erasing data stored in multiple cells of the memory.

Flash memory devices may be classified into NOR-type and NAND-type according to the type of connection between the cells and bit-lines. In NOR-type flash memory, more than two cell transistors may be coupled in parallel to one bit-line. A NOR-type flash memory stores data using hot electron injection and erases data using Fowler-Nordheim tunneling (F-N tunneling). In a NAND-type flash memory, more than two cell transistors may be coupled to one bit-line in serial. A NAND-type flash memory stores and erases data using F-N tunneling. Generally, the NOR-type flash memory configuration does not lend itself to high integration because NOR-type flash memory devices may consume large amounts of electric power. However, NOR-type flash memory devices may be advantageous for high speed operation. In contrast, NAND-type flash memory may be advantageous for high integration since NAND-type flash memory devices may consume less electric power than do NOR-type flash memory devices.

Methods for programming and/or erasing a NAND-type flash memory are disclosed, for example, in U.S. Pat. No. 5,473,563 entitled "Nonvolatile Semiconductor Memory" and U.S. Pat. No. 5,696,717 entitled "Nonvolatile Integrated Circuit Memory Devices Having Adjustable Erase/Program Threshold Voltage Verification Capability", the disclosures of both of which are hereby incorporated herein by reference in their entirety. In order to program and erase a flash memory cell, a voltage higher than a supply voltage may be supplied to the cell. The voltage for programming and/or erasing a flash memory cell is referred to herein as a "program voltage." A high/program voltage generating circuit for a flash memory is disclosed in U.S. Pat. No. 5,642,309 entitled "Auto-Program Circuit In A Nonvolatile Semiconductor Memory Device", the disclosure of which is hereby incorporated herein by reference in its entirety.

FIG. 1 is a circuit diagram illustrating an array 110 of a conventional flash memory device, which may include a plurality of strings of memory cell floating gate transistors M0 to M15. Referring to FIG. 1, a flash memory generally includes an array 110 of memory cells, each of which may include a floating gate transistor. In a NAND-type flash memory, the array 110 may include strings (so-called "NAND strings") of floating gate transistors. Each floating gate transistor M0 to M15 may be connected in serial between a string selection transistor SST and a ground selection transistor GST which are arranged in each string. Also, a plurality of word lines WL0 to WL15 are arranged to cross the NAND strings. Each word line WL0 to WL15 may be connected to a control gate of a corresponding floating gate transistor M0 to M15.

In an initial state, the floating gate transistors in the memory cells are cleared. In the cleared state, the floating gate transistors may have a threshold voltage of about −3V. In order to program a memory cell, a program voltage, for example 20V, may be supplied to a word line of a selected memory cell for a predetermined time period, which may be referred to herein as a program time or a programming interval. As a result, the threshold voltage of the selected memory cell may be raised to a higher threshold voltage. In contrast, the threshold voltages of non-selected memory cells are not raised.

However, some problems may arise when one or more of the memory cells are selected for programming among a plurality of memory cells connected to each other with same word line. For example, when a program voltage is supplied to a word line, the program voltage may be supplied not only to the selected memory cells, but also to non-selected memory cells which are connected to the same word line. As a result, the non-selected memory cells may also be programmed when the selected memory cells are programmed. This problem is referred to as a "program disturb" fault, which is an unintended programming of a non-selected memory cell connected to the selected word line.

In order to reduce program disturb faults, methods using a self-boosting scheme have been introduced. See, for example, U.S. Pat. No. 5,677,873 entitled "Method Of Programming Flash EEPROM Integrated Circuit Memory Devices To Prevent Inadvertent Programming Of Nondesignated Nand Memory Cells Therein" and U.S. Pat. No. 5,991,202 entitled "Method For Reducing Program Disturb During Self-Boosting In A NAND Flash Memory", the disclosure of which is hereby incorporated herein by reference in its entirety.

In methods for reducing program disturb faults using a self-boosting scheme, a ground path may be cut off when 0V is supplied to a gate of a ground selection transistor. A voltage of 0V may be supplied to a selected bit-line, and a supply voltage (Vcc) of 3.3V or 5V may be supplied to a non-selected bit-line as a program inhibition voltage. At the same time, a power voltage may be supplied to the gate of a string selection transistor. After the source of the string selection transistor is charged up to Vcc-Vth, where Vth is a threshold voltage (Vth) of the string selection transistor, the string selection transistor is shut off. Then, a program voltage (Vpgm) may be supplied to the selected word line and a pass voltage (Vpass) may be supplied to the non-selected word lines for boosting the channel voltage of non-selected transistors. Accordingly, F-N tunneling may not be generated between a floating gate and a channel of a non-selected transistor. As a result, the non-selected transistors may be maintained in the initial clear state.

However, a coupling may be generated between adjacent word lines and adjacent signal lines SSL, GSL, if the rise time of the program voltage supplied to a word line is short (i.e., if the slope of the generated program voltage is large). In that case, the voltage supplied to the string selection line SSL or the ground selection line GSL may be momentarily raised. In particular, the coupling generated at the string selection line SSL may discharge the boosted channel charge through the string selection transistor SST. As a result, the boosting efficiency may decrease and a program disturb fault may occur. Therefore, there remains a demand for methods for controlling a program voltage to reduce the occurrence of program disturb faults, as well as methods for providing a controlled program voltage with a stable voltage level.

SUMMARY

According to some embodiments of the inventions methods of generating a program voltage for programming a non-volatile memory device may be provided. Methods according to some embodiments include generating a first program initial voltage and generating a first ramping voltage in response to the initial voltage. The first ramping voltage has a ramping speed slower than the ramping speed of the initial voltage. A second ramping voltage is generated in response to the first ramping voltage. The second ramping voltage has a ramping speed slower than the ramping speed of the first ramping voltage. The second ramping voltage may be output as a programming voltage for programming a non-volatile memory device.

Generating a first ramping voltage may include increasing the first ramping voltage until the first ramping voltage reaches a predetermined target voltage level.

The first ramping voltage may be provided as an output voltage until the first ramping voltage reaches the predetermined target voltage level. More particularly, a reduced ramping voltage may be provided as an output voltage. The reduced ramping voltage may be provided as an output voltage while setting a program voltage of a non-volatile memory device.

The non-volatile memory device may include a plurality of string selection lines and word lines, and the ramping speed of the first ramping voltage may be selected to reduce or minimize capacitive coupling among at least some of the plurality of string selection lines and/or among at least some of the plurality of word lines of the non-volatile memory device. The non-volatile memory device may include a flash memory device.

The reduced ramping voltage may have a voltage level that is lower than the voltage level of the first ramping voltage by an amount that is based on a threshold voltage of a MOS transistor.

Generating a first ramping voltage may include increasing a voltage level in response to a clock signal. Increasing a voltage level may include charging an output load with a charge pumping circuit in response to a clock signal received by the charge pumping circuit.

In particular embodiments, the second ramping voltage may have a ripple that is lower than a ripple of the first ramping voltage. Further, increasing the ramping voltage may include gradually increasing the ramping voltage by incremental steps.

Generating the second ramping voltage may include supplying the first ramping voltage to an output driver, providing a constant current between the output driver and a ground, dividing the second ramping voltage based on a predetermined resistance ratio to provide a divided voltage, comparing the divided voltage to a predetermined reference voltage, and controlling a level of the second ramping voltage according to the comparison result.

Methods of generating a high voltage for programming a non-volatile memory device according to further embodiments of the invention include generating a first ramping voltage, outputting the first ramping voltage until the first ramping voltage reaches a predetermined level, generating a second ramping voltage having reduced ripple compared to the first ramping voltage, and outputting the second ramping voltage when the first ramping voltage reaches a predetermined level. Outputting the first ramping voltage may include reducing the voltage level of the first ramping voltage and outputting a reduced ramping voltage.

Generating a first ramping voltage may include generating a first ramping voltage having a ramping speed that is slower than a ramping speed of an input voltage. Similarly, generating first ramping voltage may include generating a first ramping voltage having a rise time that is longer than a rise time of the input voltage.

Further, generating a second ramping voltage may include generating a second ramping voltage responsive to the first ramping voltage, the second ramping voltage having a ripple that is lower than a ripple of the first ramping voltage.

Generating a second ramping voltage may further include supplying the first ramping voltage to an output driver, providing a second ramping voltage at an output of the output driver, providing a relatively constant current between the output driver and a ground, dividing the second ramping voltage based on a predetermined resistance ratio to provide a divided voltage, comparing the divided voltage to a predetermined reference voltage, and controlling a level of the second ramping voltage according to the comparison result.

A high voltage generating circuit according to some embodiments of the invention includes a high voltage generating unit configured to generate an initial voltage having a first ramping speed, a ramping circuit configured to generate a first ramping voltage in response to the initial voltage, the first ramping voltage having a second ramping speed slower than the first ramping speed, and a voltage controlling unit responsive to the ramping circuit and configured to generate a second ramping voltage having a third ramping speed slower than the second ramping speed and to output the first ramping voltage or the second ramping voltage responsive to a voltage level of the first ramping voltage. The high voltage generating unit may include a pumping circuit configured to charge an output signal to a predetermined voltage level in response to a clock signal, and a first voltage regulator configured to control the clock signal responsive to the output signal.

The first voltage regulator may be configured to enable the clock signal when the output signal is lower than a target level and to disable the clock signal when the output signal exceeds the target level.

The first ramping voltage may have a first ripple associated therewith and the second ramping voltage may have a second ripple associated therewith, the second ripple being lower than the first ripple. Furthermore, the ramping circuit may be configured to generate the first ramping voltage to have an incrementally increasing amplitude.

The voltage controlling unit may include a second voltage regulator configured to generate the second ramping voltage with a ramping speed that is slower than a ramping speed of the first ramping voltage. In particular, the second voltage regulator may include an output driver for receiving the first ramping voltage, an output terminal coupled to the output driver for outputting the second ramping voltage, and a current source unit for supplying a constant current between the output driver and a ground terminal. The second voltage regulator may further include a voltage divider coupled to the output terminal and configured to divide the second ramping voltage based on a predetermined resistance ratio, a comparator for comparing the divided voltage to a predetermined reference voltage and generating a comparison result responsive thereto, and a level controlling unit configured to control a level of the second ramping voltage according to the comparison result.

The voltage controlling unit may include a bypass circuit for outputting the first ramping voltage when the first ramping voltage is lower than a predetermined value. The bypass circuit may reduce the level of the first ramping voltage prior to outputting the first ramping voltage. In particular, the bypass circuit may include one or more transistors having predetermined threshold voltages connected in serial.

The level controlling unit may include an MOS transistor having a gate terminal coupled to the comparator, a drain terminal coupled to the output driver and a source terminal coupled to the current source unit.

The output driver may include a pair of PMOS transistors forming a current mirror. Likewise, the current source unit may include a pair of NMOS transistors forming a current mirror.

A program voltage generating circuit according to further embodiments of the invention includes a pumping circuit configured to generate a high voltage signal, a first voltage regulator coupled to the pumping circuit and configured to control a voltage level of the high voltage signal, and a ramping circuit coupled to the pumping circuit and configured to generate a first ramping voltage in response to the high voltage signal. A second voltage regulator is coupled to the ramping circuit and is configured to generate a second ramping voltage having a reduced ripple compared to the first ramping voltage. A program voltage generating circuit may further include a bypass circuit configured to reduce the first ramping voltage by a predetermined level and to output the reduced first ramping voltage when the first ramping voltage is lower than a predetermined level. In particular, the bypass circuit may include one or more transistors having predetermined threshold voltages connected in serial.

The ramping speed of the first ramping voltage may be slower than the ramping speed of the high voltage signal. Further, the second voltage regulator may be configured to generate a second ramping voltage having a ramping speed lower than the ramping speed of the first ramping voltage.

The second voltage regulator may include an output driver for receiving the first ramping voltage, an output terminal coupled to the output driver for outputting the second ramping voltage, a current source unit for supplying a constant current between the output driver and a ground terminal. A voltage divider may be coupled to the output terminal and may be configured to divide the second ramping voltage based on a predetermined resistance ratio. A comparator compares the divided voltage to a predetermined reference voltage and generates a comparison result responsive thereto, and a level controlling unit is configured to control the second ramping voltage according to the comparison result.

According to further embodiments of the invention, a non-volatile memory device includes a memory cell array having a plurality of memory cells, and a program voltage generating circuit coupled to the memory cell array and configured to generate a voltage for programming the plurality of memory cells. The program voltage generating circuit includes a high voltage generating unit configured to generate an initial voltage having a first ramping speed, a ramping circuit configured to generate a first ramping voltage having a second ramping speed slower than the first ramping speed, and a voltage controlling unit responsive to the ramping circuit and configured to generate a second ramping voltage having a third ramping speed slower than the second ramping speed and to output the first ramping voltage or the second ramping voltage responsive to a voltage level of the first ramping voltage. The high voltage generating unit may include a pumping circuit configured to charge an output signal to a predetermined voltage level in response to a clock signal, and a first voltage regulator configured to control the clock signal responsive to the output signal.

The first voltage regulator of the non-volatile memory device may be configured to enable the clock signal when the output signal is lower than a target level and to disable the clock signal when the output signal exceeds the target level.

The first ramping voltage may have a first ripple associated therewith and the second ramping voltage may have a second ripple associated therewith, the second ripple being lower than the first ripple.

The voltage controlling unit of the non-volatile memory device may include a second voltage regulator configured to generate the second ramping voltage with a third ramping speed that is slower than the second ramping speed of the first ramping voltage. In particular, the second voltage regulator may include an output driver for receiving the first ramping voltage, an output terminal coupled to the output driver for outputting the second ramping voltage, and a current source unit for supplying a constant current between the output driver and a ground terminal. The second voltage regulator may further include a voltage divider coupled to the output terminal and configured to divide the second ramping voltage based on a predetermined resistance ratio, a comparator for comparing the divided voltage to a predetermined reference voltage and generating a comparison result responsive thereto, and a level controlling unit configured to control a level of the second ramping voltage according to the comparison result.

The voltage controlling unit of the non-volatile memory device may include a bypass circuit for outputting the first ramping voltage when the first ramping voltage is lower than a predetermined value. The bypass circuit may reduce the level of the first ramping voltage prior to outputting the first ramping voltage. In particular, the bypass circuit may include one or more transistors having predetermined threshold voltages connected in serial.

In high voltage generating units according to some embodiments of the invention, the level controlling unit may include an MOS transistor having a gate terminal coupled to the comparator, a drain terminal coupled to the output driver and a source terminal coupled to the current source unit.

The output driver of the non-volatile memory device may include a pair of PMOS transistors forming a current mirror.

Likewise, the current source unit may include a pair of NMOS transistors forming a current mirror.

A non-volatile memory device according to further embodiments of the invention includes a memory cell array having a plurality of memory cells, and a high voltage generating circuit coupled to the memory cell array and configured to generate a voltage for programming the plurality of memory cells. The high voltage generating circuit may include a pumping circuit configured to generate a high voltage signal, a first voltage regulator coupled to the pumping circuit and configured to control a voltage level of the high voltage signal, and a ramping circuit coupled to the pumping circuit and configured to generate a first ramping voltage in response to the high voltage signal. A second voltage regulator is coupled to the ramping circuit and is configured to generate a second ramping voltage having a reduced ripple compared to the first ramping voltage. A bypass circuit may be configured to reduce the first ramping voltage by a predetermined level and to output the reduced first ramping voltage when the first ramping voltage is lower than a predetermined value. In particular, the bypass circuit may include one or more transistors having predetermined threshold voltages connected in serial.

The ramping speed of the first ramping voltage may be slower than the ramping speed of the high voltage signal. Further, the second voltage regulator may be configured to generate a second ramping voltage having a ramping speed lower than the first ramping speed of the first ramping voltage.

The second voltage regulator of the non-volatile memory device may include an output driver for receiving the first ramping voltage, an output terminal coupled to the output driver for outputting the second ramping voltage, a current source unit for supplying a constant current between the output driver and a ground terminal. A voltage divider may be coupled to the output terminal and may be configured to divide the second ramping voltage based on a predetermined resistance ratio. A comparator compares the divided voltage to a predetermined reference voltage and generates a comparison result responsive thereto, and a level controlling unit is configured to control the second ramping voltage according to the comparison result.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
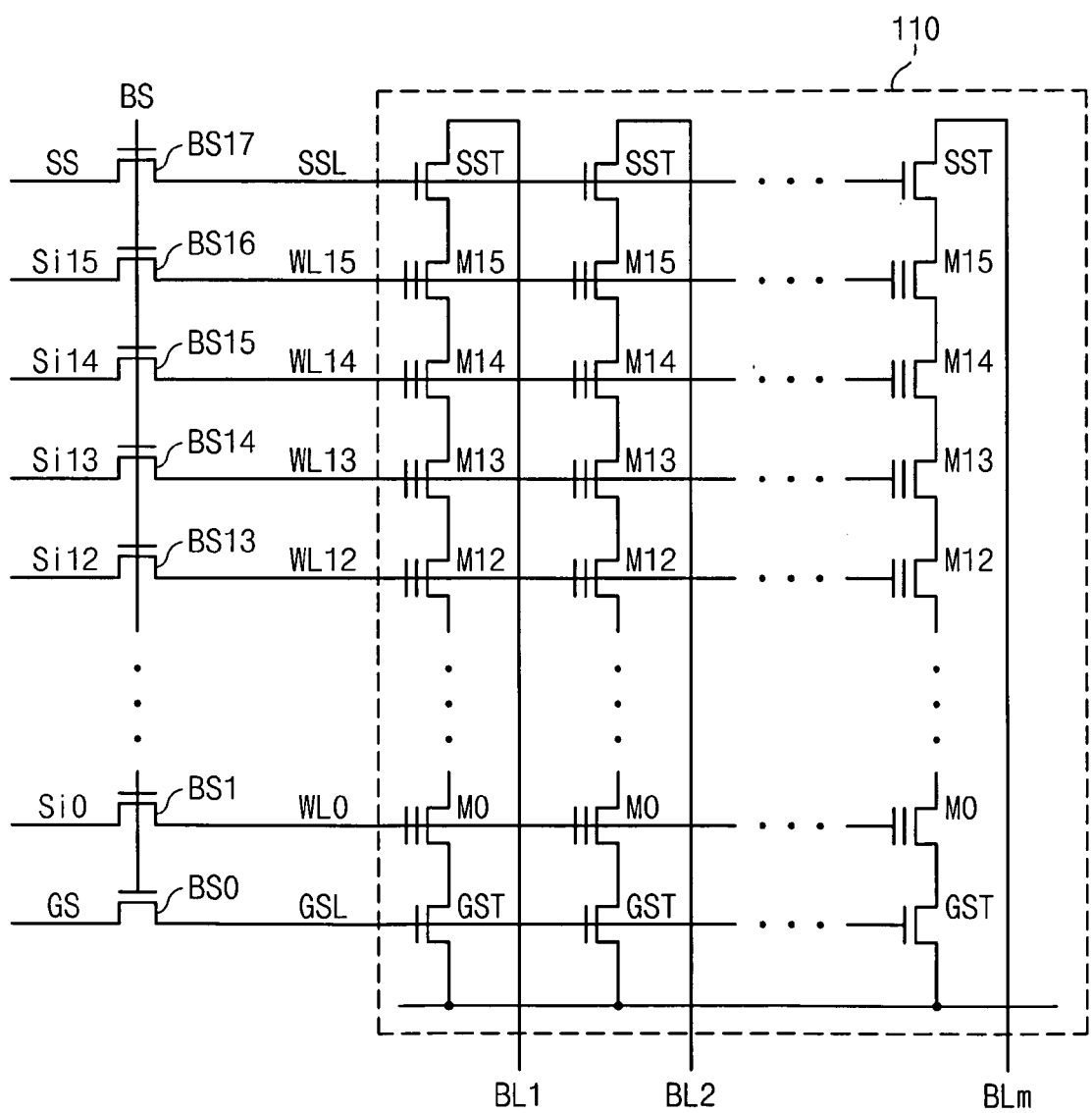
FIG. 1 is a circuit diagram illustrating a conventional flash memory configuration.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

A high voltage generating circuit and a semiconductor memory device including the same according to some embodiments of the present invention may generate a program voltage having a gradually increasing level by controlling the ramping speed of the program voltage. As used herein the term "ramping speed" means the speed by which a voltage level is increased. The term "ramping speed" generally refers to the slope or average slope of a voltage signal. For example, the ramping speed of a voltage signal that increases from a first level to a second level may be determined by dividing the difference between the second level and the first level by the rise time, i.e., the time interval required for the signal to increase from the first level to the second level.

A high voltage generating circuit according to some embodiments of the invention may provide a program voltage having a relatively low level of ripple by gradually increasing the level of the program voltage. The program voltage having reduced ripple may be supplied to a word line after the program voltage has settled. Before the program voltage has settled, a bypass circuit may supply a ramping voltage as the program voltage. As a result, a relatively stable program voltage may be supplied relatively quickly to a word line during a programming interval.

Embodiments of the invention are described with reference to a flash memory semiconductor device including a memory cell array, a column decoding circuit, a row decoding circuit and a sense amplifying circuit. The memory cell array may have a structure similar to the memory cell array shown in FIG. 1. An output voltage (Vpgm) generated by a high voltage generating circuit 100 may be supplied to a word line for programming a memory cell. However, a high voltage generating circuit 100 according to some embodiments of the invention is not limited to a flash memory device, but may be used in conjunction with other types of memory devices.

Figure 2A:
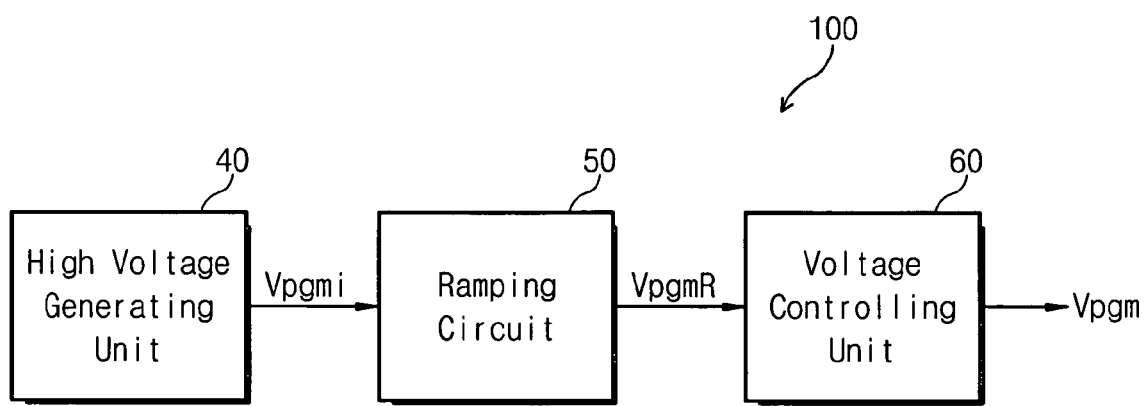
FIGS. 2A and 2B are block diagrams illustrating high voltage generating circuits in accordance with some embodiments of the invention.

FIG. 2A is a block diagram illustrating a program voltage generating circuit 100 according to some embodiments of the invention.

Referring to the embodiments of FIG. 2A, a program voltage generating circuit 100 includes a high voltage generating unit 40, a ramping circuit 50, and a voltage control unit 60. The high voltage generating unit 40 generates an initial program voltage (Vpgmi). The ramping circuit 50 generates a ramping program voltage (VpgmR) in response to the initial program voltage (Vpgmi). The ramping program voltage (VpgmR) has a ramping speed slower than the ramping speed of the initial program voltage (Vpgmi). The ramping program voltage (VpgmR) is provided to the voltage control unit 60 which is configured to reduce ripple that may be present in the ramping program voltage (VpgmR). Thus, the program voltage (Vpgm) output by the voltage control unit 60 may have lower ripple than the ramping program voltage (VpgmR).

Figure 2B:
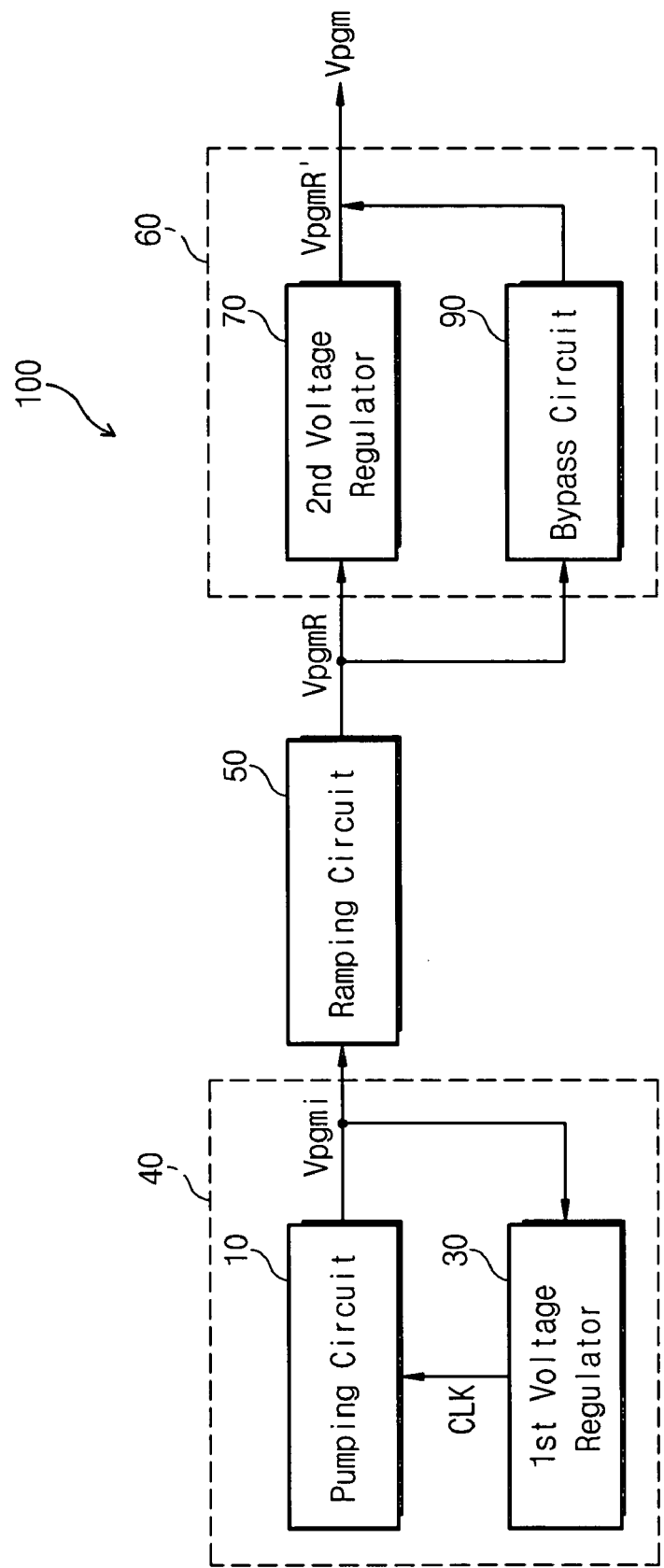

FIG. 2B is a block diagram illustrating a program voltage generating circuit 100 according to some embodiments of the invention in more detail. Referring to the embodiments of FIGS. 2A and 2B, the high voltage generating unit 40 may include a pumping circuit 10 and a first voltage regulator 30.

The voltage control unit 60 may include a second voltage regulator 70 and a bypass circuit 90.

The pumping circuit 10 may be a conventional charge pump circuit, the design of which is known in the art and need not be described herein. The pumping circuit 10 charges an output load in response to a clock signal (CLK) and generates, as an output voltage, an output voltage (Vpgmi) having a higher voltage level than a supply voltage (Vcc). The pumping circuit 10 may output the program voltage generated by a charge pumping operation to the first voltage regulator 30 and the ramping circuit 50. The first voltage regulator 30 may generate a clock signal (CLK) which is used to enable the pumping circuit 10 to generate an initial voltage (Vpgmi) having a generally constant level.

The ramping circuit 50 may generate a ramping voltage (VpgmR) having a gradually increasing voltage level by controlling the ramping speed of the ramping voltage (VpgmR) generated by the ramping circuit 50 to be slower than the ramping speed of the initial voltage (Vpgmi) generated by the pumping circuit 10. The rise time of the ramping voltage (VpgmR) generated by the ramping circuit 50 may be slow enough that capacitive coupling may not occur. As a result, the occurrence of program disturb faults that may be caused by capacitive coupling may be reduced, because the final program voltage used for programming a memory cell may be raised gradually. Ramping levels provided by the ramping circuit 50 may be provided within a predetermined range in which capacitive coupling may be reduced or eliminated.

The second voltage regulator 70 may reduce or eliminate ripple in the ramping voltage (VpgmR) in order to stabilize the final output voltage (Vpgm) that will be applied to the memory device. That is, the second voltage regulator 70 may generate a low-ripple version (VpgmR') of the ramping voltage (VpgmR). Accordingly, the ramping speed of the ramping voltage (VpgmR) may be further slowed.

The final output voltage (Vpgm) may be lower than the ramping voltage (VpgmR). Due to the operation of the second voltage regulator 70, the rise time of the voltage output by the second voltage regulator 70 may be long. That is, the ramping speed of the voltage output by the second voltage regulator 70 may be reduced as ripple in the output voltage is reduced. Accordingly, the bypass circuit 90 may provide the ramping voltage (VpgmR) less a predetermined voltage level as the output voltage (Vpgm) until the ramping voltage (VpgmR) reaches a predetermined level. After the program voltage is completely set, that is, after the ramping voltage (VpgmR) reaches the predetermined level, the second voltage regulator 70 may output a substantially ripple-free high voltage signal (VpgmR') as the output voltage (Vpgm). As a result, a stable program voltage may be supplied while minimizing the influence of controlling the voltage rise time with the second voltage regulator 70 during the programming interval. It will be appreciated that the second voltage regulator 70 may be used to reduce ripple in an un-ramped voltage such as a voltage generated by a pumping circuit 10.

Figure 3:
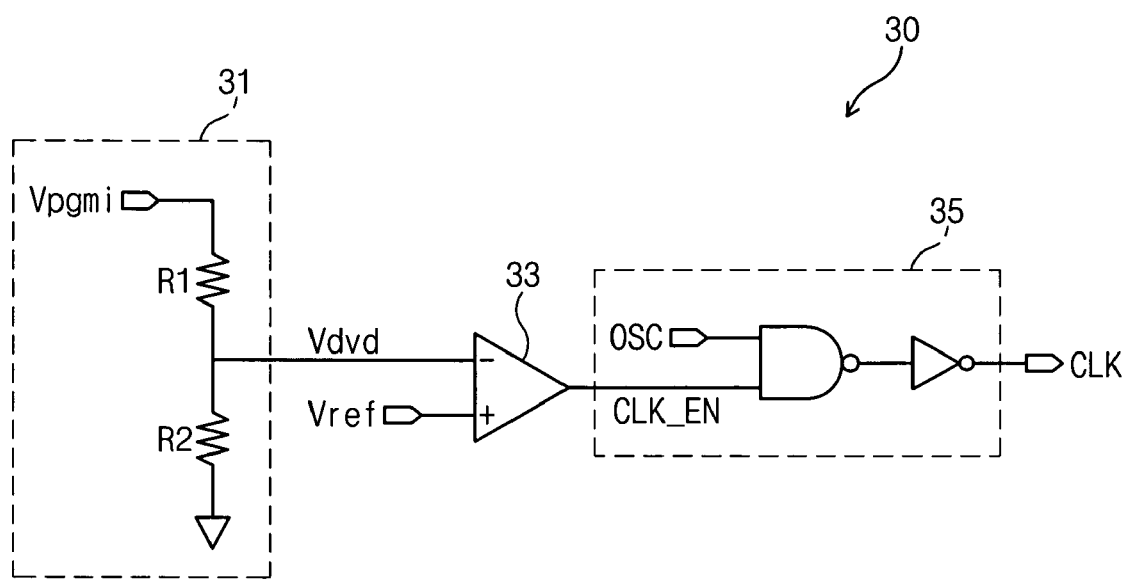
FIG. 3 is a circuit diagram illustrating a first voltage regulator in accordance with some embodiments of the invention.

Hereinafter, some functional blocks of the high voltage generating circuit 100 and their operation will be explained in more detail. FIG. 3 is a circuit diagram of a first voltage regulator 30 shown in FIG. 2B. Referring to FIGS. 2B and 3, a first voltage regulator 30 according to some embodiments of the invention may include a voltage divider 31, a comparator 33 and a clock driver 35.

The voltage divider 31 generates a divided voltage (Vdvd) by dividing a high voltage generated from the pumping circuit 10. In order to divide the initial voltage (Vpgmi), the voltage divider 31 includes resistors R1, R2 having predetermined resistances. The comparator 33 compares the divided voltage (Vdvd) generated from the voltage divider 31 and a reference voltage (Vref) input from a reference voltage generator (not shown). The comparator 33 generates a clock enable signal (CLK_EN) as a result of the comparison. For example, the comparator 33 activates the clock enable signal (CLK_EN) when the divided voltage (Vdvd) is lower than the reference voltage (Vref) and deactivates the clock enable signal (CLK_EN) when the divided voltage (Vdvd) is higher than the reference voltage (Vref). The clock driver 35 receives an oscillator signal (OSC) inputted from an oscillator (not shown), and outputs a clock signal (CLK) in response to the oscillator signal (OSC) and the clock enable signal (CLK_EN). For example, if the clock enable signal (CLK_EN) is high, the oscillating signal (OSC) is output as the clock signal (CLK). When the clock signal (CLK) is active, and the oscillating signal (OSC) is provided as the clock signal (CLK), the pumping circuit 10 increases the output voltage (Vpgmi) by charging an output load using a charge pumping operation. If the clock enable signal (CLK_EN) is low, the oscillating signal (OSC) is interrupted. In that case, the clock signal (CLK) is not toggled and the pumping operation will be deactivated, so that the voltage generated by the pumping circuit 10 does not increase further.

A certain amount of delay time may be required to generate the clock signal (CLK), which may cause ripple to be generated in the voltage (Vpgmi) generated by the pumping circuit 10. The delay time for switching the clock signal (CLK) on or off may not be avoidable when a feedback loop formed of the voltage divider 31, the comparator 33 and the clock driver 35 is used to control the on/off state of the pumping circuit 10. Accordingly, in some embodiments of the invention, the second voltage regulator 70 may reduce ripple in the program voltage and maintain the program voltage at a stable level. As a result, the second voltage regulator 70 may also reduce the possibility of overshoot of the program voltage. The second voltage regulator 70 will be discussed in more detail below with reference to FIG. 6.

In some embodiments, a high voltage generating circuit 100 may generate a program voltage by means of an Incremental Step Pulse Programming (ISPP) scheme. According to the ISPP scheme, an output voltage (Vpgm) having a constant pulse width is gradually increased from a minimum voltage to a maximum voltage during a program cycle. An ISPP scheme is described in an article by Suh et al., entitled "*A 3.3V 32 Mb NAND Flash Memory with Incremental Step Pulse Programming Scheme*", IEEE Journal of Solid-State Circuits, vol. 30, No. 11, November 1995, pp. 1149-1156, the disclosure of which is hereby incorporated herein by reference in its entirety.

According to the ISPP scheme, a target level of a program voltage gradually increases with repeating program loops of a program cycle. Each program cycle includes a program period and a program verification period. The program voltage may increase by as much as a predetermined increment (ΔVpgm) and the program time is maintained stably for each program loop.

As the program voltage is incrementally increased in each program step, coupling noise may be generated. Coupling noise is generated by capacitive coupling, which may increase between adjacent signal lines, i.e., adjacent word lines and/or string selection lines (SSL), and/or ground selection lines (GSL), because of the increased integration of semiconductor memory devices and the corresponding decreased gap between adjacent signal lines. To reduce this problem, the ramping circuit 50 may gradually increase the voltage in each program cycle until the voltage reaches the target voltage, instead of directly generating an incrementally increased program voltage at each program cycle.

Figure 4:
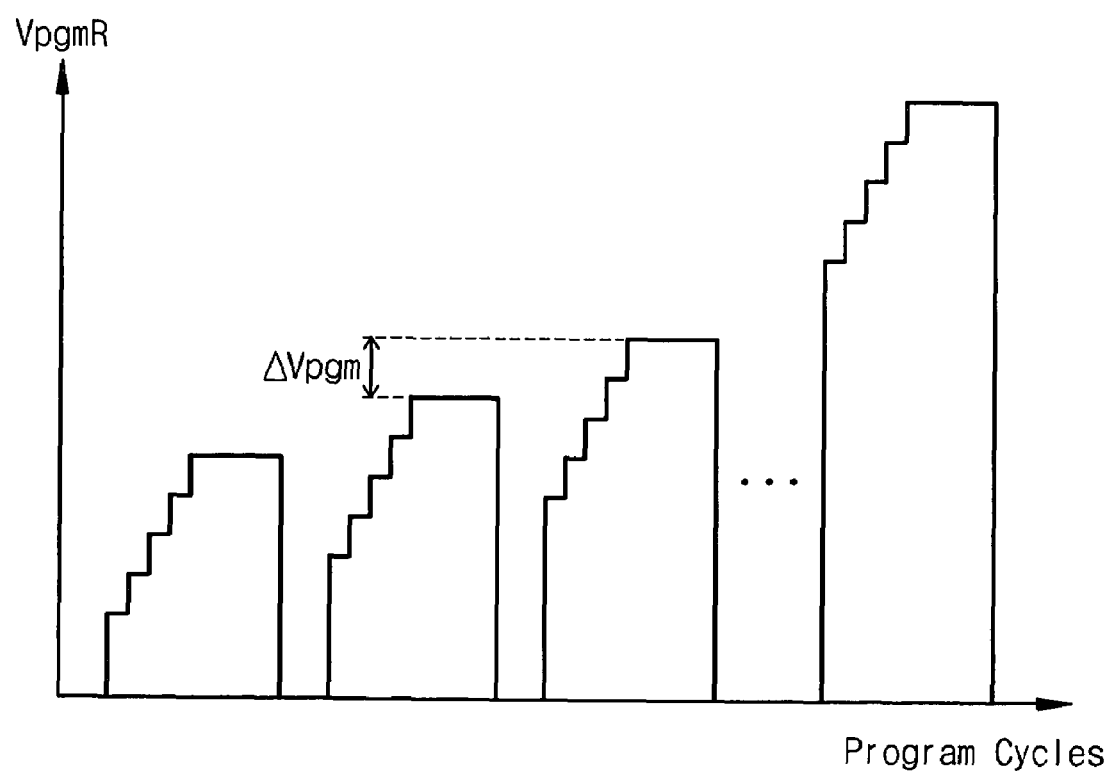
FIG. 4 is a graph illustrating a wave form of a ramping voltage generated according to a program cycle by a ramping circuit in accordance with some embodiments of the invention.

FIG. 4 is a graph showing an output waveform of a ramping voltage (VpgmR) generated in successive program cycles by a ramping circuit 50. As shown therein, the voltage generated at each step of an ISPP scheme may not be raised suddenly from 0V (or supply voltage level (Vcc)) to a target voltage in each program cycle. Rather, the voltage generated at each step of the ISPP scheme may be gradually increased by the ramping circuit 50. The rise time of the ramping voltage (VpgmR) generated from the ramping circuit 50 may be controlled to reduce or minimize capacitive coupling. As a result, the rise time of the program voltage used at each program cycle may be increased, and the reduction of boosting charge caused by coupling between string selection lines and/or word lines may be reduced and/or minimized.

Figure 5:
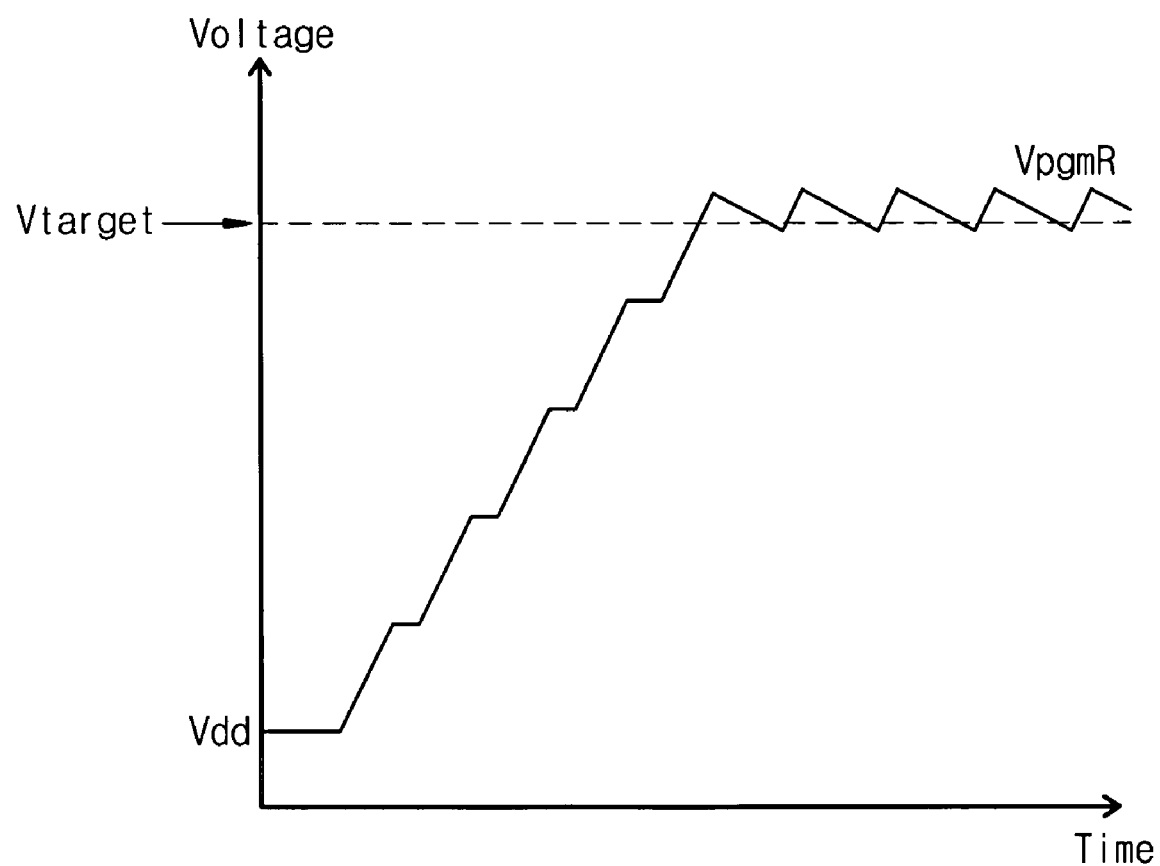
FIG. 5 is a graph illustrating a wave form of a ramping voltage generated in a program cycle among wave forms of a ramping circuit in accordance with some embodiments of the invention.

FIG. 5 is a graph showing a ramping voltage (VpgmR) generated in a program cycle. As illustrated in the embodiments of FIG. 5, some ripple may be present in the a ramping voltage (VpgmR) generated by the ramping circuit 50. That is, the ramping voltage may not be stably maintained at the target voltage level (Vtarget). As explained above, voltage ripple may result from the use of a feedback loop in the high voltage generating scheme as shown in FIG. 2. Accordingly, ripple in the ramping voltage (VpgmR) may be reduced and/or eliminated using a second voltage regulator 70. To reduce ripple in the ramping voltage (VpgmR), the second voltage regulator 70 may cause the rise time of the ramping voltage (VpgmR) to increase. That is, the second voltage regulator 70 may cause the speed by which the ramping voltage (VpgmR) is raised (hereinafter, the voltage raising speed) to be reduced.

Figure 6:
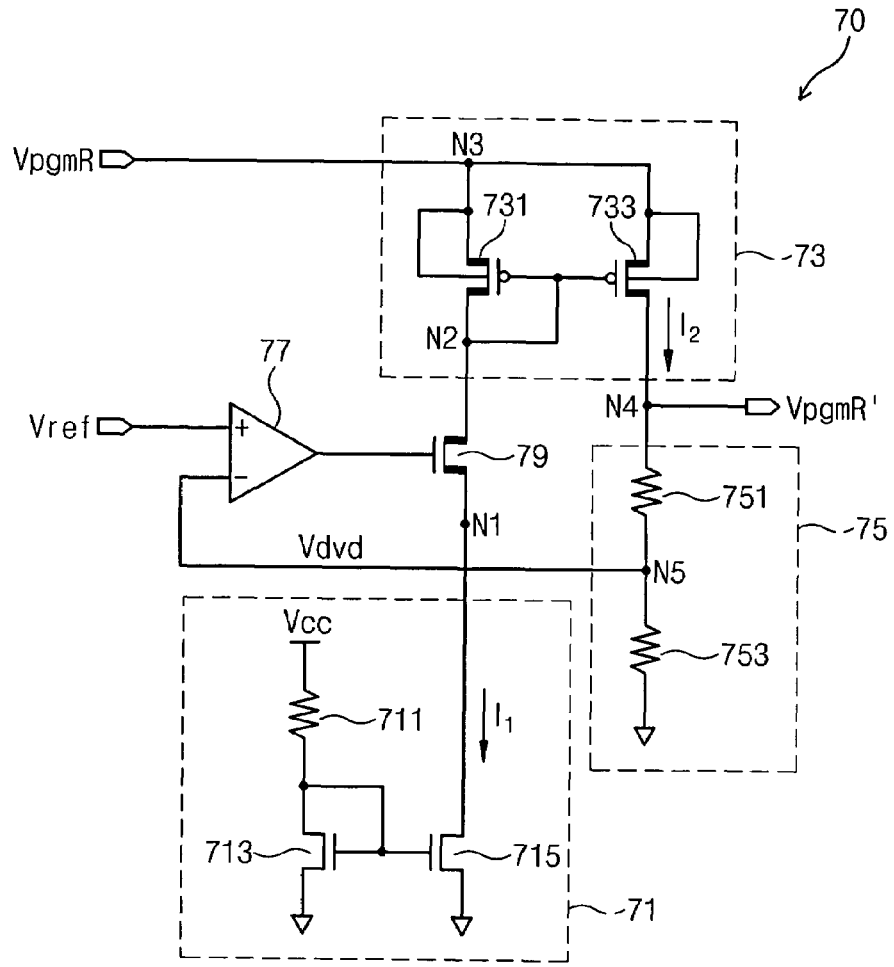
FIG. 6 is a circuit diagram illustrating a second voltage regulator in accordance with some embodiments of the invention.

FIG. 6 is a circuit diagram illustrating a second voltage regulator 70 according to some embodiments of the invention. As illustrated therein, a second voltage regulator 70 may include a current source unit 71, an output driver 73, a voltage divider 75, a comparator 77 and a level controlling unit 79.

The current source unit 71 includes a resistor 711 and a first NMOS transistor 713 which are connected in serial between a supply voltage (Vcc) and ground, and a second NMOS transistor 715 forming a current mirror with the first NMOS transistor 713. Low voltage transistors may be used for the first and the second NMOS transistors 713 and 715 in the current source unit 71. A current path of the second NMOS transistor 715 is connected between a first node N1 and ground. The first and the second NMOS transistor 713 and 715 are maintained in an on-state by a supply voltage (Vcc) to provide a first relatively constant current I1 between the first node N1 and ground.

The level controlling unit 79 is connected in serial between the output driver 73 and the first node N1. The level controlling unit 79 may include an NMOS transistor having a source terminal connected to the first node N1 and a drain terminal connected to a second node N2. The level controlling unit 79 controls the current driving ability of the circuit according to a comparison result output by the comparator 77. The output of the comparator 77 is coupled to the gate of the NMOS transistor of the level controlling unit 79. A high voltage transistor may be used as the NMOS transistor of the level controlling unit 79 to endure the ramping voltage (VpgmR) applied thereto.

The output driver 73 receives a ramping voltage (VpgmR) from the ramping circuit 50 at a third node N3. The output driver 73 includes a first PMOS transistor 731 having a drain terminal connected to a second node N2 and a source terminal connected to the third node N3, and a second PMOS transistor 733 forming a current mirror with the first PMOS transistor 731. The source terminal of the second PMOS 733 is connected to the source terminal of the first PMOS transistor 731 and the third node N3. Also, the drain terminal of the second PMOS transistor 733 is connected to a fourth node N4. An output terminal of the second voltage regulator 70 is connected to the fourth node N4, as is the voltage divider 75. High voltage transistors may be used for the PMOS transistors 731, 733 of the output driver 73 for enduring the ramping voltage (VpgmR) applied thereto.

The output driver 73 transfers a ramping voltage (VpgmR) input from the ramping circuit 50 to an output terminal. The voltage transferred to the output terminal by the output driver 73 is controlled by the amount of a second current I2 flowing between the third node N3 and the fourth node N4. The second current I2 is proportional to a current flowing between the third node N3 and the second node N2. The amplitude of the current flowing between the third node N3 and the second node N2 is determined by the resistance of a resistor 711 of the current source unit 71, and the amplitude of the current is further controlled according to the current driving ability of the level controlling unit 79.

The voltage divider 75 divides an output voltage present at the fourth node N4 of the second voltage regulator 70 according to a predetermined resistance ratio. To divide the output voltage, the voltage divider 75 includes a first resistor 751 connected between the fourth node N4 and a fifth node N5 and a second resistor 753 connected between the fifth node N5 and ground. A divided voltage (Vdvd) output at the fifth node N5 is provided to the comparator 77. That is, as long as the divided voltage Vdvd is lower than a predetermined threshold, the level controlling unit 79 will permit current to flow therethrough.

The comparator 77 receives the divided voltage (Vdvd) from the voltage divider 75 at an inverting input terminal (−), and a predetermined reference voltage (Vref) at a non-inverting input terminal (+). The comparator 77 compares the divided voltage (Vdvd) and the reference voltage (Vref) and generates a comparison result, which is provided to a gate of the NMOS transistor of the level controlling unit 79. Thus, the current driving ability of the level controlling unit 79 changes based on the comparison result of the comparator 77.

The comparator 77 outputs the comparison result, which may have a value between a ground voltage and a supply voltage (Vcc) depending on the comparison result of the two voltages input to the comparator 77. The comparison result of the comparator 77 approaches a ground voltage or a supply voltage (Vcc) when the difference between the divided voltage (Vdvd) and the reference voltage (Vref) is large. In contrast, if the difference between the divided voltage (Vdvd) and the reference voltage (Vref) is small, the comparison result of the comparator 77 will be a predetermined value between a ground voltage and a supply voltage (Vcc).

For example, if the divided voltage (Vdvd) is substantially smaller than the reference voltage (Vref) (i.e. Vdvd<Vref), the comparator 77 may generate a comparison result close to a supply voltage (Vcc). In this case, since the current driving ability of the level controlling unit 79 is sufficiently large, a current I1 supplied from the current source unit 71 is not significantly limited by the level controlling unit 79 and the output driver 73 supplies a current I2 which is relatively stable and proportional to the current I1 to the output terminal N4 used to charge an output load capacitance (not shown). Accordingly, the voltage (VpgmR') provided by the second voltage regulator 70 may increase gradually. The amplitude of the current charging the output load capacitance is obtained by subtracting the current discharged by the voltage divider 75 from the current I2 supplied from the output driver 73.

Since the ramping speed of the output voltage (VpgmR') is determined by the amplitude of the current I2 supplied from the output driver 73 and since the current I2 is proportional to the current I1 which is determined by the resistance of resistor 711, ripple in the output voltage (VpgmR') may be reduced by controlling the resistance of the resistor 711.

Since the current flowing to the voltage divider 75 may increase when the output voltage of the second voltage regulator 70 (VpgmR') increases as the output load capacitance is charged, the divided voltage (Vdvd) output by the voltage divider 75 may also increase. The divided voltage (Vdvd) may increase until the divided voltage (Vdvd) becomes equal to the reference voltage (Vref).

If the difference between the divided voltage (Vdvd) and the reference voltage (Vref) is reduced, the comparison result of the comparator 77 may start to be reduced from a value close to the supply voltage (Vcc) to a predetermined level between the supply voltage (Vcc) and ground. Accordingly, the current driving ability of the level controlling unit 79 may be reduced. Thus, the current I1 supplied from the current source unit 71 may be reduced. The current I2 supplied from the output driver 73 to the output terminal N4 may also be reduced. As a result, the ramping speed of the output voltage of the second voltage regulator 70 (VpgmR') may be slowed further.

If the divided voltage (Vdvd) is substantially larger than the reference voltage (Vref) (i.e. Vdvd>Vref), the comparator 77 generates a comparison result close to a ground voltage. Accordingly, current supplied from the current source unit 71 is not transferred to the output driver 73, since the level controlling unit 79 is turned off. Therefore, the current I2 supplied to the output terminal N4 may have a small value. In that case, the output load capacitance may be discharged by a current flowing through the voltage divider 75, causing the output load capacitance to gradually decrease. As a result, the divided voltage (Vdvd) output by the voltage divider 75 may also be reduced.

Due to the feedback effect described above, the output voltage of the second voltage regulator 70 (VpgmR') may be fixed at a level where the divided voltage (Vdvd) becomes equal to the reference voltage (Vref). When the divided voltage (Vdvd) is equal to the reference voltage (Vref), a charging current I2 supplied from the output driver 73 may become equal to a discharging current flowing to the voltage divider 75. As a result, the quantity of electric charge stored in the output load capacitance may be relatively stable, thereby maintaining the output voltage of the second voltage regulator 70 (VpgmR') at a relatively fixed level. By sufficiently slowing the ramping speed of the output voltage of the second voltage regulator 70 (VpgmR') by controlling the current I1 supplied from the current source unit 71, the output voltage of the second voltage regulator 70 (VpgmR') may not overshoot a target level and may be maintained at a substantially constant level. In particular, the level of the output voltage of the second voltage regulator 70 (VpgmR') may be equal to a target voltage level determined by the level of the reference voltage (Vref) and the resistance ratio of the voltage divider 75.

Figure 7:
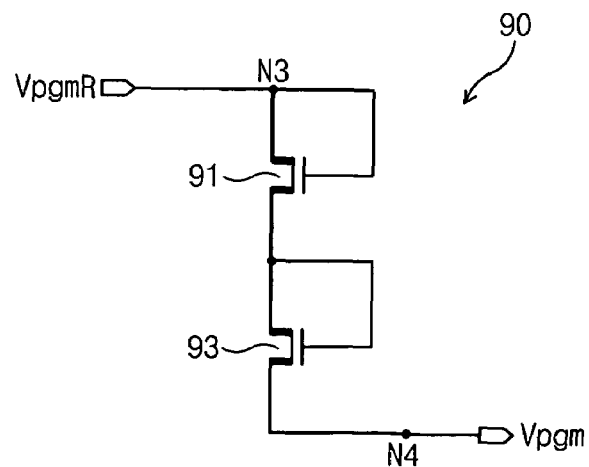
FIG. 7 is a circuit diagram illustrating a bypass circuit in accordance with some embodiments of the invention.

FIG. 7 is a circuit diagram of a bypass circuit 90 in accordance with some embodiments of the invention. As illustrated in FIG. 2B, the bypass circuit 90 may be connected in parallel with the second voltage regulator 70. In particular, the bypass circuit 90 may be connected to the second voltage regulator 70 in parallel through the third node N3 and the fourth node N4 shown in FIG. 6.

Referring to FIGS. 6 and 7, a bypass circuit 90 according to some embodiments of the invention may include first and second NMOS transistors 91 and 93 connected in serial between an input terminal (i.e., the third node N3) and an output terminal (i.e., the fourth node N4). High voltage transistors may be used for the first and the second NMOS transistor 91 and 93 to endure the program voltage (VpgmR) applied thereto. The sum of threshold voltages of the first and the second NMOS transistor 91 and 93 (i.e., 2Vth) may be set to be smaller than the breakdown voltage of the second PMOS transistor 733 of the output driver 73 so that the difference in voltage between the input voltage at node N3 and the output voltage at node N4 of the voltage regulator 70 will not cause a breakdown of the second PMOS transistor 733.

The bypass circuit 90 may be operated in the brief period before the ramping voltage (VpgmR) input through the third node N3 reaches a predetermined target voltage (Vtarget). That is, the bypass circuit 90 may be operational during the period in which the program voltage is being set by the second voltage regulator 70. During this period, the bypass circuit 90 reduces the ramping voltage (VpgmR) by a predetermined level of voltage (i.e., 2Vth) and generates the reduced ramping voltage as the final output voltage (Vpgm). Until the ramping voltage (VpgmR) reaches the target voltage (Vtarget), almost all current flows to the bypass circuit 90 which has a relatively low impedance, and very little current may flow to the second voltage regulator 70, which may have a relatively large impedance. Accordingly, during this period, the second voltage regulator 70 may not substantially influence the output signal (Vpgm) of the high voltage generating circuit 100.

When the ramping voltage (VpgmR) input to the second voltage regulator 70 reaches the predetermined target voltage (Vtarget), the current supplying path of the bypass circuit 90 is interrupted and an output signal (Vpgm) of the high voltage generating circuit 100 is determined by the second voltage regulator 70. During this period, the second voltage regulator 70 causes the incremental slope of the output ramping voltage (VpgmR') to be gentle and may reduce or eliminate ripple and/or overshoot that may exist in the input ramping voltage (VpgmR). As a result, a stable program voltage may be provided. That is, once the input ramping voltage (VpgmR) reaches a target level, voltage regulator 70 causes the output voltage (VpgmR') at node N4 to rise gradually. As the output voltage at node N4 rises, the difference between the input voltage at node N3 (VpgmR) and the output voltage at node N4 (VpgmR') decreases to less than 2Vth, which causes the bypass circuit 90 to cut off.

Figure 8:
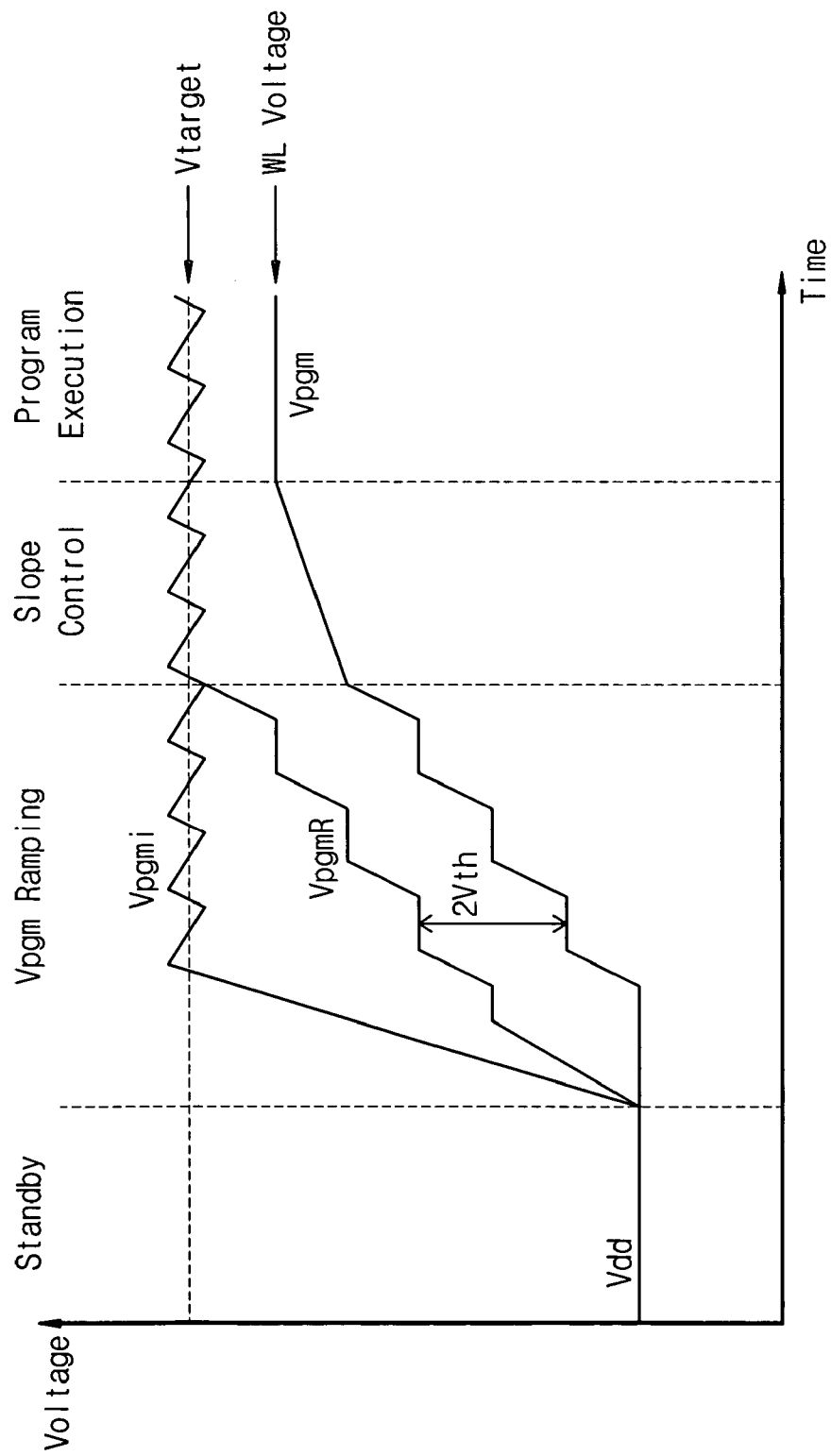
FIG. 8 is a graph illustrating a wave form of a program voltage generated from a high voltage generating circuit in accordance with some embodiments of the invention.

FIG. 8 is a graph showing an exemplary wave form of a output voltage (Vpgm) generated by a high voltage generating circuit 100 according to some embodiments of the invention. Referring to FIGS. 2 and 8, an initial voltage (Vpgmi) is rapidly raised to a target voltage (Vtarget) when the pumping circuit 10 starts to generate a high voltage. In response to the generation of the initial voltage (Vpgmi) by the pumping circuit 10, the ramping circuit 50 restricts the rising speed of the program voltage to a range that may not generate capacitive coupling. The ramping circuit 50 generates a ramping voltage (VpgmR) which is raised gradually to the target voltage (Vtarget). As a result, the occurrence of program disturb faults caused by capacitive coupling may be reduced or prevented.

However, there may be ripple having predetermined amplitude about a center of the target voltage (Vtarget) as shown in FIG. 8. The generated ripple may influence the programming characteristic of a memory cell and make the distribution of threshold voltages wider. Accordingly, in some embodiments of the invention, the second voltage regulator 70 may control the voltage rising speed of the ramping voltage (VpgmR) in order to reduce or eliminate ripple in the final output voltage (Vpgm). As a result, ripple in the output voltage (Vpgm) may be reduced while reducing or eliminating program disturb faults caused by capacitive coupling.

However, while ripple may be reduced by the operation of the second voltage regulator 70, a longer time may be required for setting the program voltage due to the reduced voltage rising speed. Accordingly, the bypass circuit 90 may provide the ramping voltage (VpgmR) as a final output voltage (Vpgm) while the second voltage regulator 70 is raising its output voltage (i.e. or while a level of the ramping voltage (VpgmR) is lower than the target voltage). Until the ramping voltage VpgmR reaches a target level, a voltage provided by the bypass circuit 90 may be lower by 2Vth than the ramping voltage (VpgmR). Also when the level of the ramping voltage (VpgmR) reaches the target voltage, a relatively ripple free voltage (VpgmR') generated by the second voltage regulator 70 is output as a final output voltage (Vpgm). As a result, the influence of the voltage rise time during the programming interval may be reduced or minimized, and the program voltage may be maintained at a relatively constant level.

Figure 9:
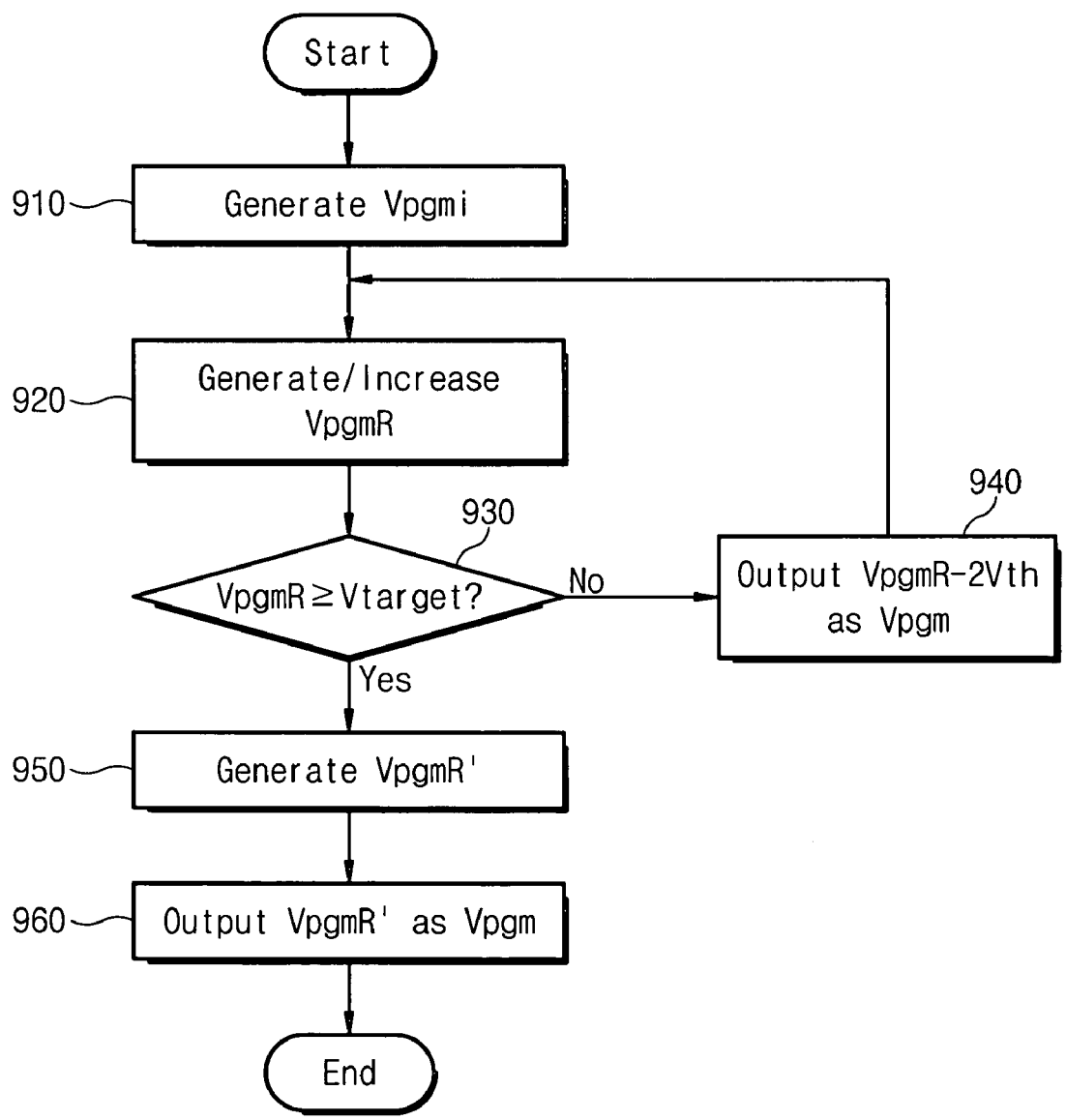
FIG. 9 is a flowchart illustrating methods according to some embodiments of the invention.

FIG. 9 is a flowchart illustrating methods 900 according to some embodiments of the invention. As illustrated therein, an initial voltage (Vpgmi) is generated (block 910). As discussed above, the initial voltage (Vpgmi) may be generated by a charge pumping circuit 10 as illustrated in FIG. 2B. However, due to feedback control of the voltage level output by the charge pumping circuit 10, there may be some ripple in the initial voltage Vpgmi.

A ramping voltage (VpgmR) is then generated/increased in response to the generation of the initial voltage (Vpgmi) (block 920). The ramping program voltage (VpgmR) may be generated by a ramping circuit 50 as illustrated in FIG. 2B.

If the ramping voltage (VpgmR) does not exceed a target voltage (Vtarget) (block 930), the ramping voltage (less 2Vth) is output as the final output voltage (Vpgm) (block 940). However, if the ramping voltage VpgmR is greater than or equal to the target voltage, a ramping voltage VpgmR' having reduced ripple is generated (block 950). As illustrated in FIG. 2B, ripple in the ramping voltage (VpgmR) may be reduced by a second voltage regulator 70. The ripple-reduced ramping voltage (VpgmR') is then output as the final output voltage (Vpgm) for programming a non-volatile semiconductor memory device (block 960).

As described above, a program voltage generating circuit and a semiconductor memory device according to some embodiments of the invention may reduce the occurrence of program disturb faults by controlling the rise time of a program voltage within a range that may not result in capacitive coupling sufficient to cause a program disturb fault.

Moreover, a high voltage generating circuit and semiconductor memory device according to some embodiments of the invention may reduce the influence of controlling the voltage raising speed during a programming interval, and may provide a stable program voltage.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:
1. A method of generating a high voltage for programming a non-volatile memory device, comprising:
   generating an initial voltage having a first voltage ramping speed and increasing the initial voltage up to a first programming voltage during a programming operation for the non-volatile memory device;

generating a first ramping voltage in response to the initial voltage, the first ramping voltage having a second ramping speed slower than the first ramping speed and increasing the first ramping voltage up to the first programming voltage while the initial voltage is at the first programming voltage during the programming operation; and generating a second ramping voltage in response to the first ramping voltage, the second ramping voltage having a third ramping speed slower than the second ramping speed and increasing the second ramping voltage up to a second programming voltage that is lower than the first programming voltage during the programming operation.

2. The method of claim 1, further comprising outputting the first-ramping voltage until the first ramping voltage reaches a predetermined target voltage level and then outputting the second ramping voltage instead of the first ramping voltage, wherein the second ramping voltage has lower ripple than the first ramping voltage.

3. The method of claim 2, wherein outputting the first ramping voltage comprises reducing a voltage level of the first ramping voltage and outputting a reduced first ramping voltage.

4. The method of claim 3, wherein the reduced first ramping voltage has a voltage level that is lower than the voltage level of the first ramping voltage by an amount that is based on a threshold voltage of a MOS transistor.

5. The method of claim 3, wherein the reduced first ramping voltage is output while setting a program voltage of the non-volatile memory device.

6. The method of claim 5, wherein the non-volatile memory device includes a plurality of string selection lines and a plurality of word lines, and wherein the ramping speed of the first ramping voltage is selected to reduce or minimize capacitive coupling among at least some of the plurality of string selection lines and/or among at least some of the plurality of word lines of the non-volatile memory device.

7. The method of claim 5, wherein the non-volatile memory device comprises a flash memory device.

8. The method of claim 1, wherein generating a first voltage comprises increasing a voltage level in response to a clock signal.

9. The method of claim 8, wherein increasing a voltage level comprises charging an output load with a charge pumping circuit in response to a clock signal received by the charge pumping circuit.

10. The method of claim 1, wherein the first ramping voltage has a first ripple and the second ramping voltage has a second ripple less than the first ripple.

11. The method of claim 1, wherein increasing the first ramping voltage comprises gradually increasing the first ramping voltage by incremental steps.

12. A high voltage generating circuit, comprising:
a high voltage generating unit configured to generate an initial voltage having a first ramping speed and configured to increase the initial voltage up to a target voltage level and to maintain the initial voltage at the target voltage level;
a ramping circuit configured to generate a first ramping voltage in response to the initial voltage, the first ramping voltage having a second ramping speed slower than the first ramping speed and configured to increase the first ramping voltage up to the target voltage level while the initial voltage is at the target voltage level; and
a voltage controlling unit responsive to the ramping circuit and configured to generate a second ramping voltage having a third ramping speed slower than the second ramping speed, and to selectively output the first ramping voltage or the second ramping voltage responsive to a voltage level of the first ramping voltage.

13. The high voltage generating circuit of claim 12, wherein the high voltage generating unit comprises:
a pumping circuit configured to charge an output signal to a predetermined voltage level in response to a clock signal; and
a first voltage regulator configured to control the clock signal responsive to the output signal.

14. The high voltage generating circuit of claim 13, wherein the first voltage regulator is configured to enable the clock signal when the output signal is lower than a threshold voltage level and to disable the clock signal when the output signal exceeds the threshold voltage level.

15. The high voltage generating circuit of claim 12, wherein the first ramping voltage has a first ripple associated therewith and the second ramping voltage has a second ripple associated therewith, the second ripple being lower than the first ripple.

16. The high voltage generating circuit of claim 12, wherein the ramping circuit is configured to generate the first ramping voltage to have an incrementally increasing amplitude.

17. The high voltage generating circuit of claim 12, wherein the voltage controlling unit comprises a second voltage regulator configured to generate the second ramping voltage with a third ramping speed that is slower than the second ramping speed of the first ramping voltage.

18. The high voltage generating circuit of claim 12, wherein the voltage controlling unit comprises a bypass circuit for outputting the first ramping voltage when the first ramping voltage is lower than a predetermined value; and wherein the bypass circuit reduces the level of the first ramping voltage prior to outputting the first ramping voltage.

19. The high voltage generating circuit of claim 12, wherein the voltage controlling unit comprises a bypass circuit for outputting the first ramping voltage when the first ramping voltage is lower than a predetermined value; and wherein the bypass circuit includes one or more transistors having predetermined threshold voltages connected in serial.

20. A non-volatile memory device comprising a high voltage generating circuit as recited in claim 12 coupled to a memory cell array having a plurality of memory cells and configured to generate a voltage for programming the plurality of memory cells.

21. The non-volatile memory device of claim 20, wherein the high voltage generating unit comprises:
a pumping circuit configured to charge an output signal to a predetermined voltage level in response to a clock signal; and
a first voltage regulator configured to control the clock signal responsive to the output signal.

22. The non-volatile memory device of claim 21, wherein the first voltage regulator is configured to enable the clock signal when the output signal is lower than a threshold voltage level and to disable the clock signal when the output signal exceeds the threshold voltage level.

23. The non-volatile memory device of claim 21, wherein the first ramping voltage has a first ripple associated therewith and the second ramping voltage has a second ripple associated therewith, the second ripple being lower than the first ripple.

24. The non-volatile memory device of claim 23, wherein the ramping circuit is configured to generate the first ramping voltage to have an incrementally increasing amplitude.

25. The non-volatile memory device of claim 20, wherein the voltage controlling unit comprises a second voltage regulator configured to generate the second ramping voltage with a ramping speed that is slower than a ramping speed of the first ramping voltage.

26. The non-volatile memory device of claim 20, wherein the voltage controlling unit comprises a bypass circuit for outputting the first ramping voltage when the first ramping voltage is lower than a predetermined value.

27. The non-volatile memory device of claim 26 wherein the bypass circuit reduces the level of the first ramping voltage prior to outputting the first ramping voltage.

28. The non-volatile memory device of claim 26, wherein the bypass circuit includes one or more transistors having predetermined threshold voltages connected in serial.

29. A high voltage generating circuit, comprising:
a high voltage generating unit configured to generate an initial voltage having a first ramping speed;
a ramping circuit configured to generate a first ramping voltage in response to the initial voltage, the first ramping voltage having a second ramping speed slower than the first ramping speed; and
a voltage controlling unit responsive to the ramping circuit and configured to generate a second ramping voltage having a third ramping speed slower than the second ramping speed, and to output the first ramping voltage or the second ramping voltage responsive to a voltage level of the first ramping voltage;
wherein the voltage controlling unit comprises a second voltage regulator configured to generate the second ramping voltage with a third ramping speed that is slower than the second ramping speed of the first ramping voltage; and
wherein the second voltage regulator comprises:
an output driver for receiving the first program voltage;
an output terminal coupled to the output driver for outputting the second ramping voltage;
a current source unit for supplying a constant current between the output driver and a ground terminal;
a voltage divider coupled to the output terminal and configured to divide the second ramping voltage based on a predetermined resistance ratio;
a comparator for comparing the divided voltage to a predetermined reference voltage and generating a comparison result responsive thereto; and
a level controlling unit configured to control a level of the second program voltage according to the comparison result.

30. The high voltage generating circuit of claim 29, wherein the level controlling unit comprises an MOS transistor having a gate terminal coupled to the comparator, a drain terminal coupled to the output driver and a source terminal coupled to the current source unit.

31. The high voltage generating circuit of claim 29, wherein the output driver comprises a pair of PMOS transistors forming a current mirror.

32. The high voltage generating circuit of claim 29, wherein the current source unit comprises a pair of NMOS transistors forming a current mirror.

33. A non-volatile memory device, comprising a high voltage generating circuit, the high voltage generating circuit comprising:
a high voltage generating unit configured to generate an initial voltage having a first ramping speed;
a ramping circuit configured to generate a first ramping voltage in response to the initial voltage, the first ramping voltage having a second ramping speed slower than the first ramping speed; and
a voltage controlling unit responsive to the ramping circuit and configured to generate a second ramping voltage having a third ramping speed slower than the second ramping speed, and to output the first ramping voltage or the second ramping voltage responsive to a voltage level of the first ramping voltage;
wherein the high voltage generating circuit is coupled to a memory cell array having a plurality of memory cells and is configured to generate a voltage for programming the plurality of memory cells;
wherein the voltage controlling unit comprises a second voltage regulator configured to generate the second ramping voltage with a ramping speed that is slower than a ramping speed of the first ramping voltage; and
wherein the second voltage regulator comprises:
an output driver for receiving the first ramping voltage;
an output terminal coupled to the output driver for outputting the second ramping voltage;
a current source unit for supplying a constant current between the output driver and a ground terminal;
a voltage divider coupled to the output terminal and configured to divide the second ramping voltage based on a predetermined resistance ratio;
a comparator for comparing the divided voltage to a predetermined reference voltage and generating a comparison result responsive thereto; and
a level controlling unit configured to control a level of the second ramping voltage according to the comparison result.

34. The non-volatile memory device of claim 33, wherein the level controlling unit comprises an MOS transistor having a gate terminal coupled to the comparator, a drain terminal coupled to the output driver and a source terminal coupled to the current source unit.

35. The non-volatile memory device of claim 33, wherein the output driver comprises a pair of PMOS transistors forming a current mirror.

36. The non-volatile memory device of claim 33, wherein the current source unit comprises a pair of NMOS transistors forming a current mirror.

37. A method of generating a high voltage, comprising:
generating an initial voltage having a first voltage ramping speed;
generating a first ramping voltage in response to the initial voltage, the first ramping voltage having a second ramping speed slower than the first ramping speed; and
generating a second ramping voltage in response to the first ramping voltage, the second ramping voltage having a third ramping speed slower than the second ramping speed;
wherein generating the second ramping voltage in response to the first ramping voltage comprises:
supplying the first ramping voltage to an output driver;
providing a second ramping voltage at an output of the output driver;
providing a relatively constant current between the output driver and a ground;
dividing the second ramping voltage based on a predetermined resistance ratio to provide a divided voltage;
comparing the divided voltage to a predetermined reference voltage; and
controlling a level of the second ramping voltage according to the comparison result.

38. A high voltage generating circuit, comprising:
- a high voltage generating unit configured to generate an initial voltage having a first ramping speed and configured to increase the initial voltage up to a target voltage level and to maintain the initial voltage at the target voltage level;
- a ramping circuit configured to generate a first ramping voltage in response to the initial voltage, the first ramping voltage having a second ramping speed slower than the first ramping speed and configured to increase the first ramping voltage up to the target voltage level while the initial voltage is at the target voltage level; and
- a voltage controlling unit responsive to the ramping circuit and configured to generate a second ramping voltage having a third ramping speed slower than the second ramping speed, and comprising a bypass circuit configured to output the first ramping voltage when the first ramping voltage is lower than a predetermined value.

* * * * *